(12) United States Patent
Sorada et al.

(10) Patent No.: US 7,119,417 B2
(45) Date of Patent: Oct. 10, 2006

(54) SEMICONDUCTOR DEVICE AND FABRICATION METHOD THEREOF

(75) Inventors: Haruyuki Sorada, Hirakata (JP); Takeshi Takagi, Kyoto (JP); Akira Inoue, Takatsuki (JP); Yoshio Kawashima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 81 days.

(21) Appl. No.: 10/948,747

(22) Filed: Sep. 24, 2004

(65) Prior Publication Data

US 2005/0133834 A1   Jun. 23, 2005

(30) Foreign Application Priority Data

Sep. 25, 2003   (JP) ............................. 2003-333218

(51) Int. Cl.
   *H01L 31/117*   (2006.01)
(52) U.S. Cl. ........................ 257/616; 257/382
(58) Field of Classification Search ................ 257/616, 257/192, 382, 384, 408
See application file for complete search history.

(56) References Cited

U.S. PATENT DOCUMENTS 6,503,833 B1*   1/2003   Ajmera et al. .............. 438/682
6,657,223 B1*   12/2003  Wang et al. ................... 257/19
6,867,428 B1*   3/2005   Besser et al. .................. 257/19
2003/0057439 A1*   3/2003   Fitzgerald .................... 257/192

FOREIGN PATENT DOCUMENTS

| JP | 8-167718 | 6/1996 |
|---|---|---|
| JP | 2964925 B2 | 8/1999 |
| JP | 2002-314089 | 10/2002 |

OTHER PUBLICATIONS

Hoyt, J. L. et al., "Strained Silicon MOSFET Technology", Microsystems Technology Laboratory, MIT, Cambridge, MA, Dec. 2002.
Donaton R. A. et al., "Co Silicide formation on SiGeC/Si and SiGe/Si layers" Apl. Phys. Lett. 70 (10), Mar. 10, 1997.

* cited by examiner

*Primary Examiner*—Mark V. Prenty
(74) *Attorney, Agent, or Firm*—McDermott Will & Emery LLP

(57) ABSTRACT

A semiconductor device of this invention includes: a semiconductor substrate; a gate electrode formed on the semiconductor substrate; a pair of source and drain electrodes respectively formed in regions of the semiconductor substrate situated on opposite sides of the gate electrode in a plan view; and a germanium-containing channel layer situated below the gate electrode to sandwich an gate insulator therebetween and intervening between the pair of source and drain electrodes, wherein a silicide layer forming at least a part of the source and drain electrodes has a lower germanium concentration than the channel layer.

6 Claims, 11 Drawing Sheets

SEMICONDUCTOR DEVICE AND FABRICATION METHOD THEREOF

BACKGROUND OF THE INVENTION

1. Field of the Invention

The present invention relates to a semiconductor device and a fabrication method thereof and, more particularly, to a transistor including a semiconductor layer containing germanium.

2. Description of the Related Art

According to the International Technology Roadmap for Semiconductors (ITRS2001), not only alteration of design rule generations but also introduction of new materials and structures will be accelerated after the 65 nm-generation process. One of the causes of such acceleration is that it becomes more difficult to obtain satisfactory drive current than before due to source voltage scaling, deterioration of carrier mobility and the like. In attempt to solve these problems, a proposal has been made of a device in which a new material having a high carrier mobility such as strained silicon or silicon-germanium (SiGe) is introduced into the channel thereof (see J. L. Hoyt and seven others, "Strained Silicon MOSFET Technology", International Electron Device Meeting (IEDM) 2002, P23–26 for example.)

Silicon-germanium has a higher carrier (hole) mobility than silicon. For this reason, the use of silicon-germanium for the p-channel of a field effect transistor makes it possible to realize a higher-speed operation without relying upon miniaturization.

A heterojunction dynamic threshold MOS transistor has been proposed as the art of enhancing the performance of a transistor having a heterojunction channel containing a silicon-germanium layer (see Japanese Patent Laid-Open Publication No. 2002-314089.)

Also, a proposal has been made of a technique on a high-performance transistor with a strained silicon channel formed by adopting a silicon-germanium layer as a substrate.

Also, a germanium-containing cobalt silicide phase formation technique has been reported such that the value of resistance of a silicide layer can be lowered by simply raising the annealing temperature (see R. A. Donaton and six others, "Co silicide formation on SiGeC/Si and SiGe/Si layers", Applied Physics letter 70(10), 10 Mar. 1997, P1266–1268.)

Also, a proposal has been made of a source and drain structure raised up by selective epitaxial growth of a silicon layer as a technique of reducing the parasitic resistance of source and drain (see Japanese Patent Publication No. 2964925.)

At present, however, silicon-germanium for use in channels is different from silicon in the reaction temperature causing reaction with cobalt, which is frequently used as a silicide material for forming source and drain electrodes. As a result, the annealing temperature need to be 100–200° C. higher than the conventional annealing temperature (about 600–700° C.) in order to obtain a Co(SiGe) phase having a resistance as low as that of a $CoSi_2$ phase. Accordingly, the process temperature hysteresis becomes undesirably higher, causing impurity diffusion, lattice strain relaxation and the like to occur, which might result in a failure to obtain desired impurity concentration profile and electrical characteristics. On the other hand, a special relaxed silicon-germanium substrate is presently needed in fabricating a transistor employing strained silicon. Since a silicon-germanium layer having a μm-order thickness is present in such a substrate underlying a strained silicon layer as thin as about 20 nm, a problem arises such that the temperature for forming a low-resistant silicide layer also becomes higher.

Further, germanium is a contamination source against the silicon process and, hence, its influence on the device reliability is concerned about. Therefore, device structure and fabrication process contrived to prevent germanium contamination are indispensable for such devices as mentioned above.

SUMMARY OF THE INVENTION

The present invention has been made to solve the foregoing problems and, accordingly, a first object of the present invention is to provide a semiconductor device which allows a low-resistant silicide phase to be formed therein despite its having a high mobility channel into which germanium is introduced, and a fabrication method thereof.

A second object of the present invention is to provide a semiconductor device fabrication method capable of minimizing germanium contamination.

To attain the aforementioned objects, a semiconductor device according to the present invention includes: a semiconductor substrate; a gate electrode formed on the semiconductor substrate; a pair of source and drain electrodes respectively formed in regions of the semiconductor substrate situated on opposite sides of the gate electrode in a plan view; and a channel layer situated below the gate electrode to sandwich an gate insulator therebetween and intervening between the pair of source and drain electrodes, wherein: at least one of the channel layer and an underlayer directly underlying the channel layer contains germanium; and a silicide layer forming at least a part of the source and drain electrodes has a lower germanium concentration than one of the channel layer and the underlayer.

In such a construction wherein the silicide layer of the source and drain electrodes has a lower germanium concentration than one of the channel layer and the underlayer, a low-resistant silicide phase can be formed at a lower temperature than in the prior art. As a result, it becomes possible to secure a process temperature margin, hence, suppress the concentration profile change due to impurity diffusion and the lattice strain relaxation.

Preferably, the germanium concentration of the silicide layer is more than 0 atomic % and not more than 5 atomic %. This feature allows a low-resistant silicide phase to be formed at a low temperature reliably, thus making it possible to form a transistor of high driving force.

More preferably, the silicide layer is substantially germanium-free.

The channel layer may have a heterojunction between silicon and a silicon-germanium layer or a silicon-germanium-carbon layer. This feature enhances the drive current.

The channel layer may form a p-channel when conducting.

It is possible that the underlayer is a relaxed silicon-germanium layer while the channel layer is a strained silicon layer formed on the relaxed silicon-germanium layer. This feature enhances the drive current.

It is possible that: the source and drain electrodes have source and drain regions each formed by an impurity diffusion region; a body region having a different conductivity type from the source and drain regions is formed below the channel layer to contact the source and drain regions; and the gate electrode is electrically connected to the body region. This feature allows the threshold voltage of the gate electrode to lower, thereby enabling the semiconductor device comprising the transistor to operate at a low voltage.

It is possible that: a side protection film formed by an insulating film is formed to cover sides of the gate electrode;

a pair of extension layers are formed to be positioned below the side protection film; and the channel layer is electrically connected to the pair of source and drain electrodes by the pair of extension layers.

A method of fabricating a semiconductor device according to the present invention includes: step A of forming a channel layer and an underlayer directly underlying the channel layer on a semiconductor substrate, at least one of the channel layer and the underlayer containing germanium; step B of forming a gate insulator on the channel layer; step C of forming a gate electrode on the gate insulator; step D of respectively forming extension layers in regions of the semiconductor substrate situated on opposite sides of the gate electrode in a plan view in such a manner that each of the extension layers extends from a surface of each of said regions to a location below the channel layer, the extension layers each formed by an impurity diffusion layer; step E of forming a side protection film formed by an insulating film in such a manner that the side protection film covers sides of the gate electrode; step F of removing portions situated on opposite sides across the gate electrode and the side protection film in plan view, each of said portions extending through layers inclusive of from the gate insulator to a germanium-containing one of the channel layer and the underlayer; step G of forming source and drain regions directly under respective of surfaces of the substrate exposed by the removal of said portions of the gate insulator and the channel layer, the source and drain regions each formed by an impurity diffusion region having a same conductivity type as the extension layers; and step H of forming silicide layers in respective of regions of the semiconductor substrate from which said portions of the layers inclusive of from the gate insulator to the germanium-containing one of the channel layer and the underlayer have been removed, thereby forming source and drain electrodes having the silicide layers and the source and drain regions.

With this method, the germanium-containing channel layer is removed from the regions of the semiconductor substrate in which the silicide layers are formed and, thereafter, the silicide layers are formed in the regions. Therefore, germanium, which impedes the formation of a low-resistant phase, is absent in those regions except portions connecting to the extension layers in the formation of the silicide layers. As a result, the formation of a high-mobility channel containing germanium can be realized, with the occurrence of parasitic resistance in the source and drain electrodes being suppressed. As a result, it becomes possible to obtain a semiconductor device comprising a transistor having higher driving force than the prior art.

In the steps E and F, it is possible to deposit the insulating film over an entire surface of the semiconductor substrate having been subjected to the step D and then over-etch the insulating film entirely by anisotropic etching, thereby to form the side protection film comprising the insulating film on sidewall of the gate electrode while, at the same time, removing said portions situated on the opposite sides across the gate electrode and the side protection film in plan view. With this feature, the germanium-containing semiconductor layer (i.e., at least one of the channel layer and the underlayer) is removed by a single step and, hence, the semiconductor device under fabrication, except the portions connecting to the extension layers, will not be exposed directly to germanium in the succeeding steps. This makes it possible to reduce the risk of germanium contamination.

The anisotropic etching may be dry etching.

In the step H, after the step G, it is possible to form silicon layers by selective growth of silicon in respective of said regions of the semiconductor substrate having been subjected to the removal of said portions and then produce the silicon layers into silicides to form the silicide layers. This feature allows steps formed by the removal of the germanium-containing semiconductor layer to be filled up with the silicon layers, thus making it possible to form the silicide layers having a lower resistance.

In the step A, it is possible to epitaxially grow a silicon-germanium layer or a silicon-germanium-carbon layer and a silicon layer sequentially on a silicon substrate as the semiconductor substrate, thereby to form the channel layer having a heterojunction between silicon and silicon-germanium or silicon-germanium-carbon.

The channel layer may form a p-channel when conducting.

In the step A, it is possible to epitaxially grow a relaxed silicon-germanium layer and a silicon layer sequentially on a silicon substrate as the semiconductor substrate, thereby to form the underlayer and the channel layer.

The method may further include the step of electrically connecting the gate electrode to a body region formed below the channel layer and having a different conductivity type from the source and drain regions.

Another method of fabricating a semiconductor device according to the present invention includes: step A of forming a gate insulator on a semiconductor substrate comprising germanium or silicon-germanium; step B of forming a gate electrode on the gate insulator; step C of respectively forming extension layers in regions of the semiconductor substrate situated on opposite sides of the gate electrode in a plan view in such a manner that each of the extension layers extends to a first predetermined depth, the extension layers each formed by an impurity diffusion layer; step D of forming a side protection film comprising an insulating film in such a manner that the side protection film covers sides of the gate electrode; step E of removing portions situated on opposite sides across the gate electrode and the side protection film in plan view, each of said portions extending through the gate insulator to a second predetermined depth of the semiconductor substrate; step F of forming source and drain regions directly under respective of surfaces of the semiconductor substrate exposed by the removal of said portions, the source and drain regions each formed by an impurity diffusion region having a same conductivity type as the extension layers; and step G of respectively forming silicide layers in regions of the semiconductor substrate having been subjected to the removal of said portions, thereby forming source and drain electrodes having the silicide layers and the source and drain regions.

In the steps D and E, it is possible to deposit the insulating film over an entire surface of the semiconductor substrate having been subjected to the step C and then over-etch the insulating film entirely by anisotropic etching, thereby forming the side protection film formed by the insulating film on sidewall of the gate electrode while, at the same time, removing said portions of the insulating film and the semiconductor substrate situated on the opposite sides across the gate electrode and the side protection film in plan view. This feature makes it possible to obtain a semiconductor device comprising a germanium or silicon-germanium field effect transistor having higher driving force than the prior art.

In the step G, after the step F, it is possible to respectively form silicon layers by selective growth of silicon in said regions of the semiconductor substrate having been subjected to the removal of said portions and then produce the silicon layers into silicides to form the silicide layers.

The foregoing and other objects, features and advantages of the present invention will become more apparent from the reading of the following detailed description of the invention with reference to the accompanying drawings.

DETAILED DESCRIPTION OF THE PREFERRED EMBODIMENTS

Hereinafter, preferred embodiments of the present invention will be described with reference to the drawings.

(First Embodiment)

Figure 1:
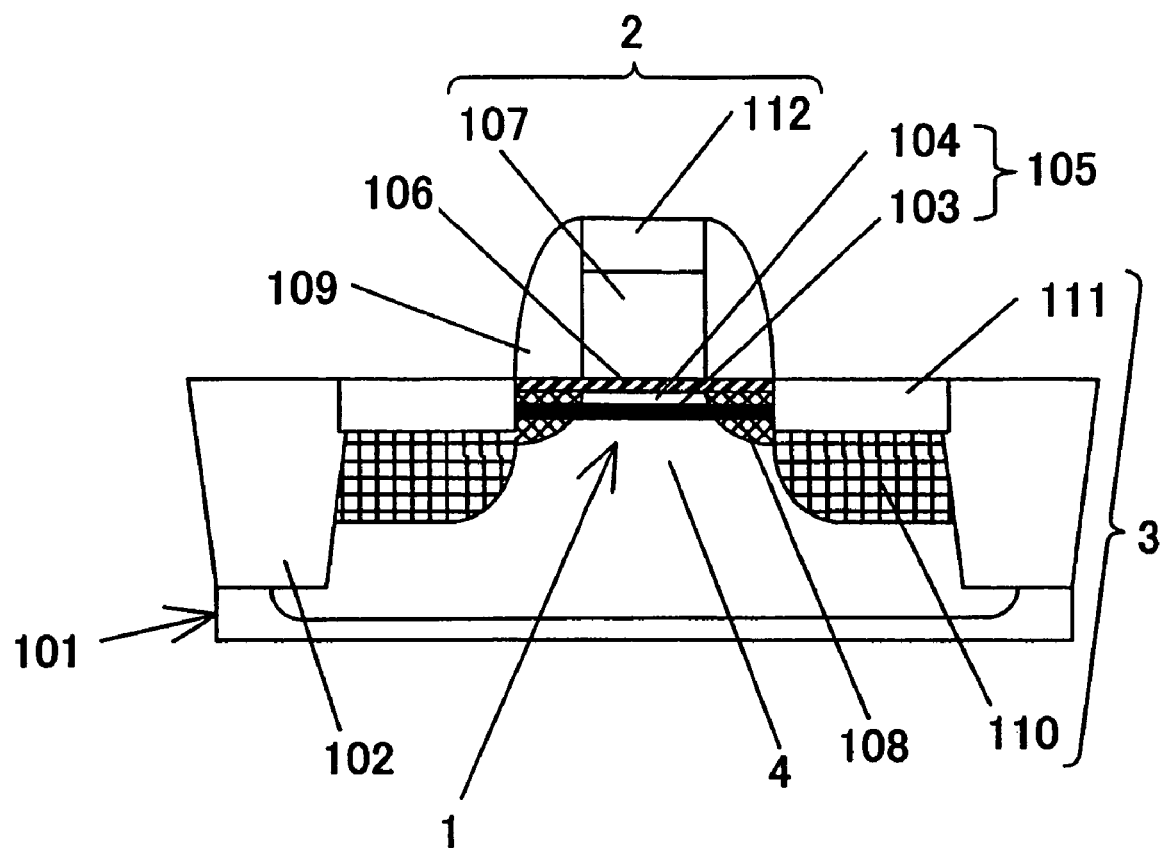
FIG. 1 is a sectional view schematically showing a sectional structure of a semiconductor device according to the first embodiment of the present invention.

FIG. 1 is a sectional view schematically showing a sectional structure of a semiconductor device according to the first embodiment of the present invention.

As shown in FIG. 1, the semiconductor device according to the present embodiment comprises a p-channel heterojunction field effect transistor. The semiconductor device has a bulk silicon substrate 101 (hereinafter will be referred to as "substrate" simply) doped with a p-type impurity (for example B: boron). The substrate 101 is provided with a device isolation film 102 having an opening extending to a predetermined depth from the surface. Here, the device isolation film 102 comprises a silicon oxide film and has a thickness ranging from 200 to 500 nm. The region of the substrate 101 situated within the opening of the device isolation film 102 constitutes an active region 1. A gate electrode body 107 is formed on the surface of this active region 1. The gate electrode body 107 is formed by high-concentration degenerate p-type polysilicon doped with boron to a concentration not less than $5 \times 10^{19}$ atoms/cm² for example. A silicide layer 112 is formed on top of the gate electrode body 107. The silicide layer 112 is formed by a cobalt silicide ($CoSi_2$) layer having a thickness not more than 40 nm (specifically a thickness of about 25 nm in this example). The gate electrode body 107 and the silicide layer 112 constitute a gate electrode 2. The gate electrode 2, i.e., the gate electrode body 107 and the silicide layer 112, has sides covered with a side protection film 109. The side protection film 109 is formed by a silicon nitride or silicon oxide film having a width not more than about 100 nm. A gate insulator 106 is formed directly under the gate electrode body 107 and the side protection film 109. The gate insulator 106 is formed by a silicon oxide or silicon oxynitride film or an insulating film having a high dielectric constant such as $HfO_2$ and has an equivalent oxide thickness EOT ranging from about 1 to about 6 nm.

In a portion of the active region 1 situated below the gate insulator 106 are formed a silicon layer 104, a silicon-germanium layer 103 and extension layers 108. The extension layers 108 are formed on respective of opposite sides of the gate electrode 2 in plan view so as to be positioned substantially below the side protection film 109. The extension layers 108 each formed by a high-concentration degenerate p-type impurity diffusion layer doped with boron to a concentration not less than $1 \times 10^{19}$ atoms/cm². The silicon layer 104, which is undoped, is formed below the gate electrode 2 so as to be connected to the two extension layers 108,108 at its opposite ends. The silicon layer 104 is formed to have a thickness not more than 15 nm (specifically a thickness of 3 nm in this example). The silicon-germanium layer 103 is formed so as to be connected to the two extension layers 108, 108 at its opposite ends and joined with the silicon layer 104. The silicon-germanium layer 103 is formed to have a thickness not more than 20 nm (specifically a thickness of about 10 nm in this example) and a germanium concentration ranging from 15% to 50% (specifically about 30% in this example). The silicon-germanium layer 103 and the silicon layer 104 form a heterojunction and constitute a channel layer 105. Though both of the silicon layer 104 and the silicon-germanium layer 103 extend into the extension layers 108, 108 (particularly the silicon-germanium layer 103 is so seen in FIG. 1), these extensions have impurity diffusion and hence form part of the extension layers 108,108. Accordingly, the extensions do not form part of the silicon layer 104 and silicon-germanium layer 103 in the completed semiconductor device shown in FIG. 1. In the present invention, the "channel layer" means a layer including a region that functions as a channel. Since in the present embodiment, a channel is formed in a region around the junction between the silicon-germanium layer 103 and the silicon layer 104, the silicon-germanium layer 103 and the silicon layer 104 correspond to the channel layer.

Silicide layers are formed in respective of portions of the active region 1 situated on opposite sides across the gate electrode 2 and side protection film 109 in plan view so as to extend from the surface to a predetermined depth. Each of the silicide layers 111 is formed by a cobalt silicide ($CoSi_2$)

layer having a thickness not more than 40 nm (specifically a thickness of about 25 nm in this example). Under respective of the silicide layers are formed source and drain regions 110 each formed by a high-concentration impurity diffusion region. The source and drain regions each comprise a high-concentration degenerate p-type impurity diffusion layer doped with boron, which is a p-type impurity, to a concentration not less than $5 \times 10^{19}$ atoms/cm$^2$. The source and drain regions 110 and the silicide layers 111 constitute source and drain electrodes 3. In use, one of the source and drain electrodes 3 serves as the source and the other serves as the drain. An n-type well 4 constituting a body region is formed in a region of the active region 1 having its top surface defined by the silicon-germanium layer 103, extension layers 108 and source and drain regions 110.

Description will be made of a fabrication method of the semiconductor device thus constructed. FIGS. 2 to 11 are sectional views illustrating the fabrication method of the semiconductor device shown in FIG. 1 step by step.

Figure 2:
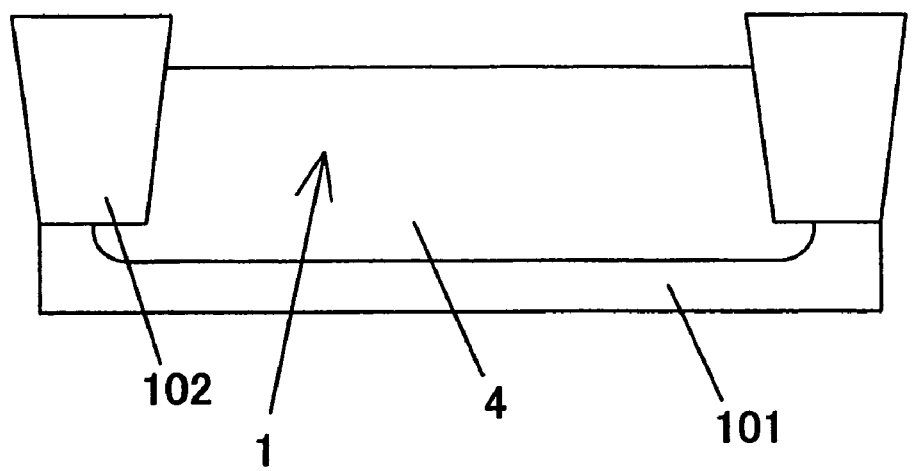
FIG. 2 is a sectional view illustrating each step of a fabrication method of the semiconductor device shown in FIG. 1.

In the step illustrated in FIG. 2, the device isolation film 102 (thickness: 200 to 500 nm) is formed on the conventional bulk silicon substrate 101 (p-type (100)) using STI (Shallow Trench Isolation) or the like. Thus, the active region 1 is formed. Thereafter, the n-type well 4 of the transistor is formed by phosphorus ion implantation and activation annealing.

Figure 3:
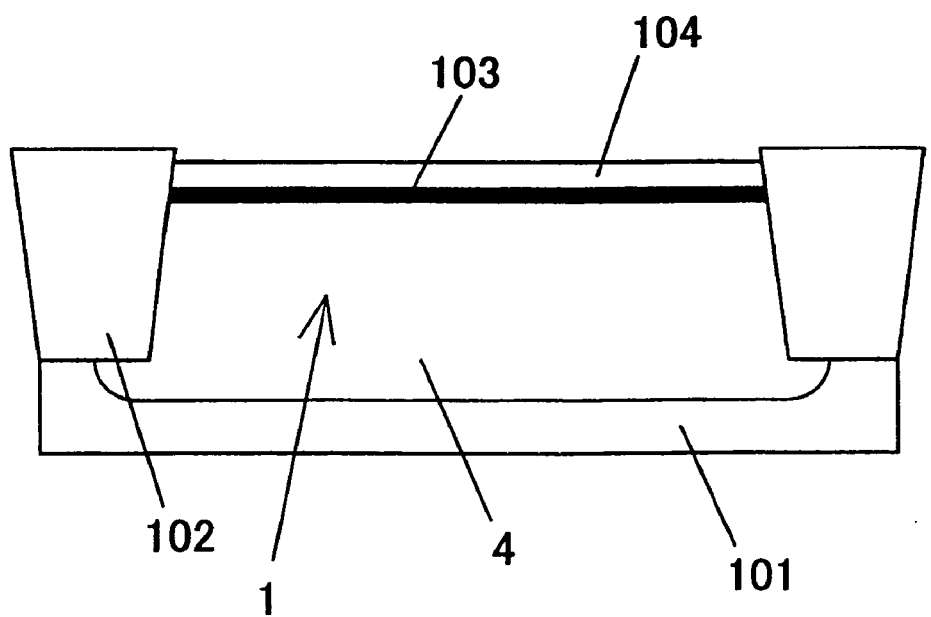
FIG. 3 is a sectional view illustrating each step of the fabrication method of the semiconductor device shown in FIG. 1.

Subsequently, in the step illustrated in FIG. 3, undoped silicon-germanium layer 103 (thickness: not more than 15 nm, Ge concentration: 15% to 50%) and undoped silicon layer 104 (thickness: not more than 15 nm) are sequentially epitaxially grown on the surface of the active region 1 selectively by the UHV-CVD process or a like process. By so doing, the heterojunction constituted by the silicon layer 104 and the silicon-germanium layer 103 is formed. In this embodiment, the thicknesses of the silicon layer 104 and the silicon-germanium layer 103 (hereinafter will be represented by Si/SiGe) are about 5 nm and about 10 nm (hereinafter will be expressed "about 5/10 nm" for example), respectively, and the Ge concentration of the silicon-germanium layer 103 is about 30%.

Figure 4:
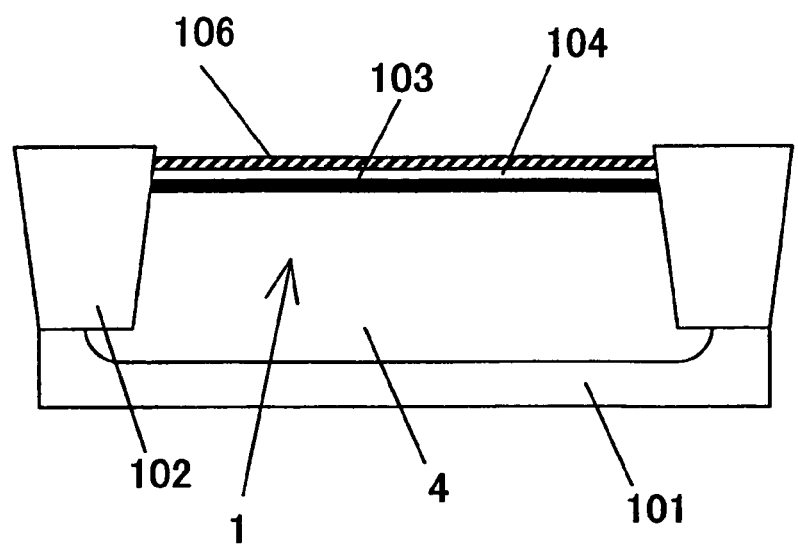
FIG. 4 is a sectional view illustrating each step of the fabrication method of the semiconductor device shown in FIG. 1.

Thereafter, in the step illustrated in FIG. 4, the surface of the substrate 101 is cleaned, and then a silicon oxynitride film 106' (equivalent oxide thickness: about 1 to about 6 nm, specifically about 2 nm in this example) which will be the gate insulator is formed on the silicon layer 104. At that time, the thicknesses of the silicon layer 104 and the silicon-germanium layer 103, namely Si/SiGe, become about 3/10 nm, which is a final design value.

Figure 5:
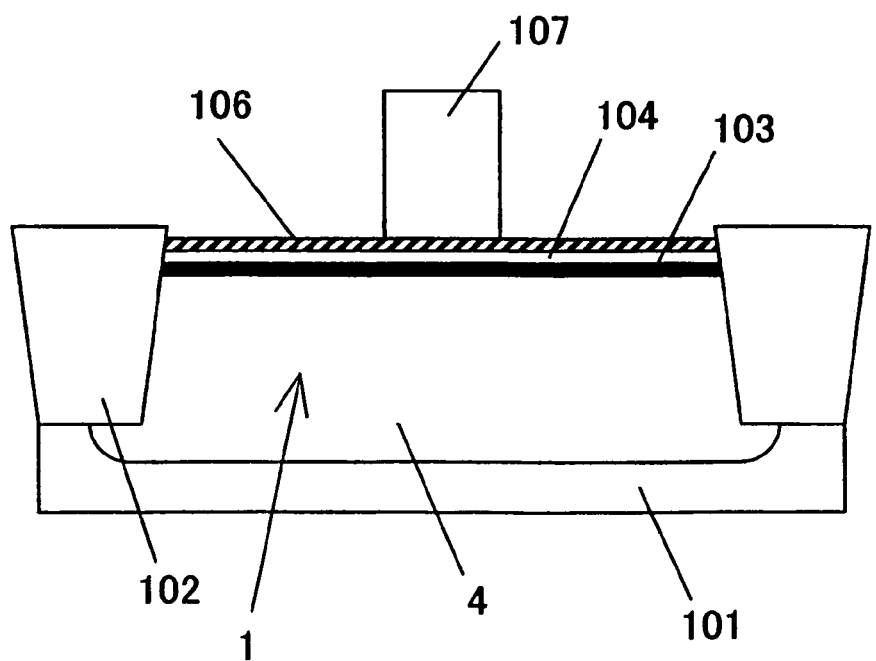
FIG. 5 is a sectional view illustrating each step of the fabrication method of the semiconductor device shown in FIG. 1.

Thereafter, in the step illustrated in FIG. 5, a polysilicon film which will be the gate electrode body is deposited over the entire surface of the substrate 101 by the LPCVD process or a like process and then subjected to ion implantation and dry etching, to form the gate electrode body 107 made of high-concentration degenerate p-type polysilicon.

Figure 6:
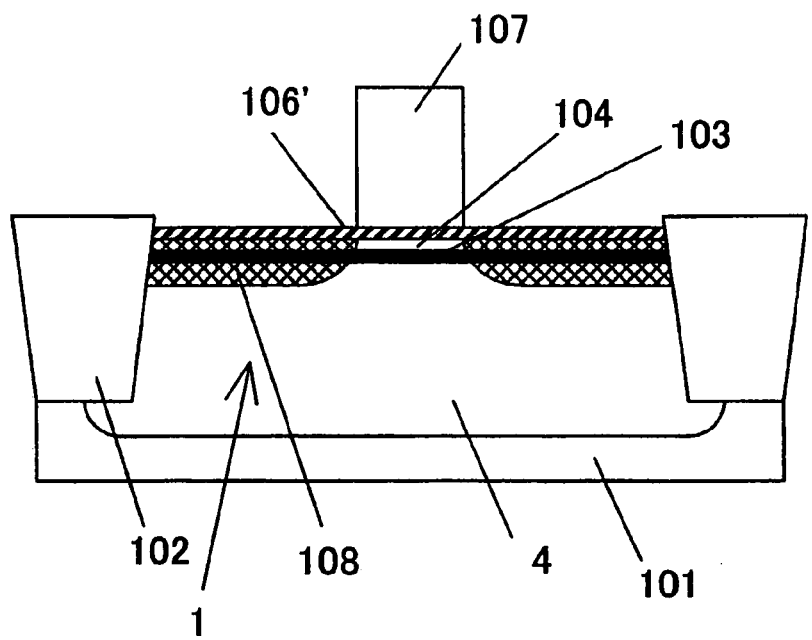
FIG. 6 is a sectional view illustrating each step of the fabrication method of the semiconductor device shown in FIG. 1.

Subsequently, in the step illustrated in FIG. 6, boron, which is a p-type impurity, is ion-implanted into the substrate 101 over the gate electrode body 107 to form the extension layers 108 each comprising a high-concentration p-type impurity diffusion layer having a concentration not less than $1 \times 10^{19}$ atoms/cm$^2$. At that time, part of the silicon-germanium layer 103 is present in the extension layers 108. (Therefore, this part forms part of the extension layers 108.)

Figure 7:
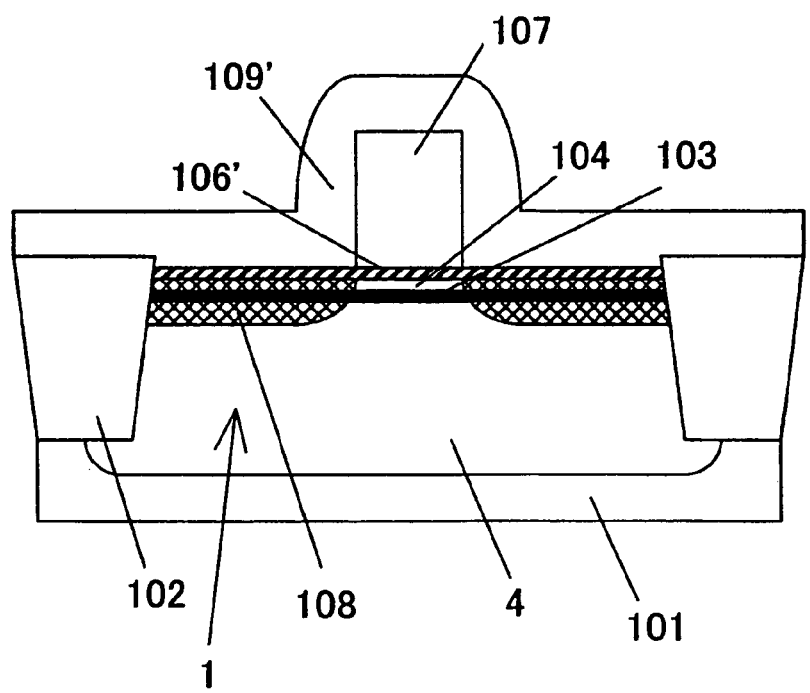
FIG. 7 is a sectional view illustrating each step of the fabrication method of the semiconductor device shown in FIG. 1.

In turn, in the step illustrated in FIG. 7, a silicon oxide film or silicon nitride film 109' (thickness: not more than 200 nm) which will be the side protection film is deposited over the entire surface of the substrate 101.

Subsequently, in the step illustrated in FIG. 8, the entire surface of the substrate 101 is etched back by dry etching to form the side protection film 109 (width: not more than 100 nm) on the sidewall portion of the gate electrode body 107.

Figure 9:
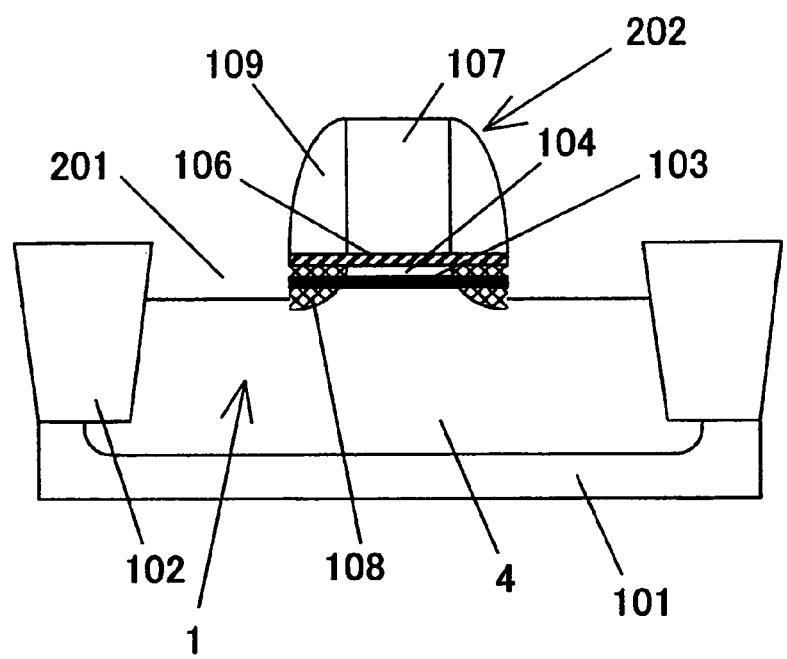
FIG. 9 is a sectional view illustrating each step of the fabrication method of the semiconductor device shown in FIG. 1.

Continuously, in the step illustrated in FIG. 9, the entire surface of the substrate 101 is intentionally over-etched to remove the silicon oxynitride film 106', silicon layer 104 and silicon-germanium layer 103. By so doing, an annular recess 201 is formed around a stacked structure 202 in which the gate electrode body 107 and side protection film 109 are stacked on the underlying silicon layer 104 and silicon-germanium layer 103.

Subsequently, in the step illustrated in FIG. 10, the substrate 101 is subjected to ion implantation of a p-type impurity such as boron over the aforementioned stacked structure 202 and then undergoes Rapid Thermal Annealing (RTA) at 900° C. or higher for 60 seconds or shorter. This process step forms a high-concentration p-type impurity diffusion layer 110 having a concentration not less than $5 \times 10^{19}$ atoms/cm$^2$ directly under the recess 201, the impurity diffusion layer 110 comprising silicon only. The p-type impurity diffusion layer 110 constitutes the source and drain regions.

Figure 11:
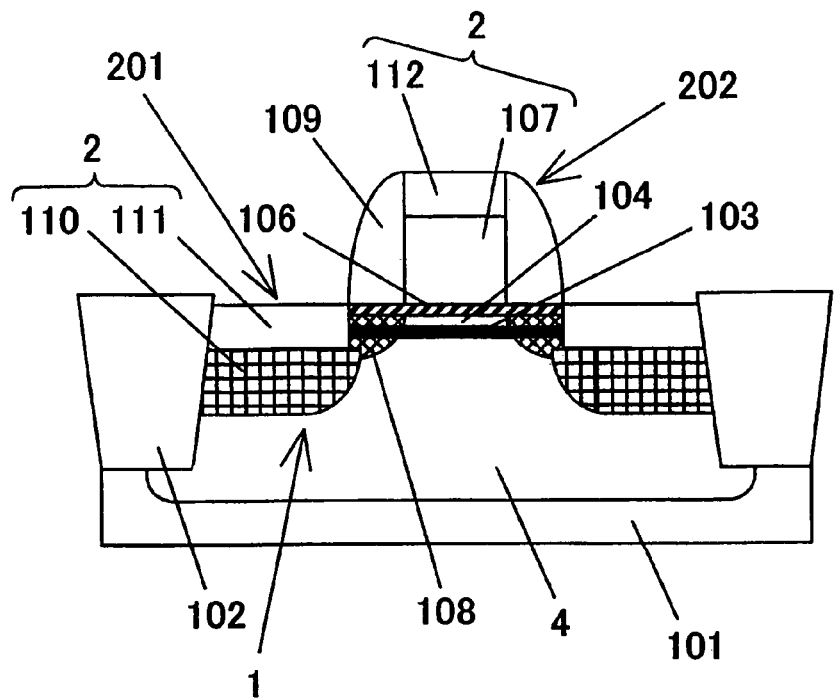
FIG. 11 is a sectional view illustrating each step of the fabrication method of the semiconductor device shown in FIG. 1.

Subsequently, in the step illustrated in FIG. 11, cobalt silicide layers 111 and 112 (CoSi$_2$ phase, thickness: not more than 40 nm, specifically about 25 nm in this example) are formed on the source and drain regions and the gate electrode body 107.

Specifically, cobalt is first deposited to a thickness not more than 20 nm, specifically to a thickness of about 10 nm in this example by sputtering or a like process, and then Rapid Thermal Annealing (RTA) is performed at a temperature not higher than 600° C. (preferably 400° C. or higher), specifically at 500° C. in this embodiment, for about one minute to allow cobalt to react with silicon forming the source and drain regions and the gate electrode body 107, thereby forming a CoSi$_2$ phase having a high resistance (several tens of $\Omega/\square$). Thereafter, unreacted cobalt remaining on the device isolation film 102 and the side protection film 109 is eliminated by cleaning. This obviates short-circuiting between the source and drain electrodes and the gate electrode. Thereafter, RTA is performed at a temperature not lower than 600° C., specifically at 700° C. in this example, for about one minute to form the silicide layers 111 and 112 each comprising a CoSi$_2$ phase having a low resistance (several $\Omega/\square$). In this case the RTA temperature is preferably not lower than 600° C. and lower than 800° C., more preferably, not lower than 600° C. and not higher than 750° C. The cobalt silicide layer 111 is formed to fill up the recess 201.

Thereafter, non-illustrated process steps including inter-layer insulator formation, contact hole formation and wire formation are performed to complete the semiconductor device comprising a p-channel heterojunction field effect transistor.

Figure 17:
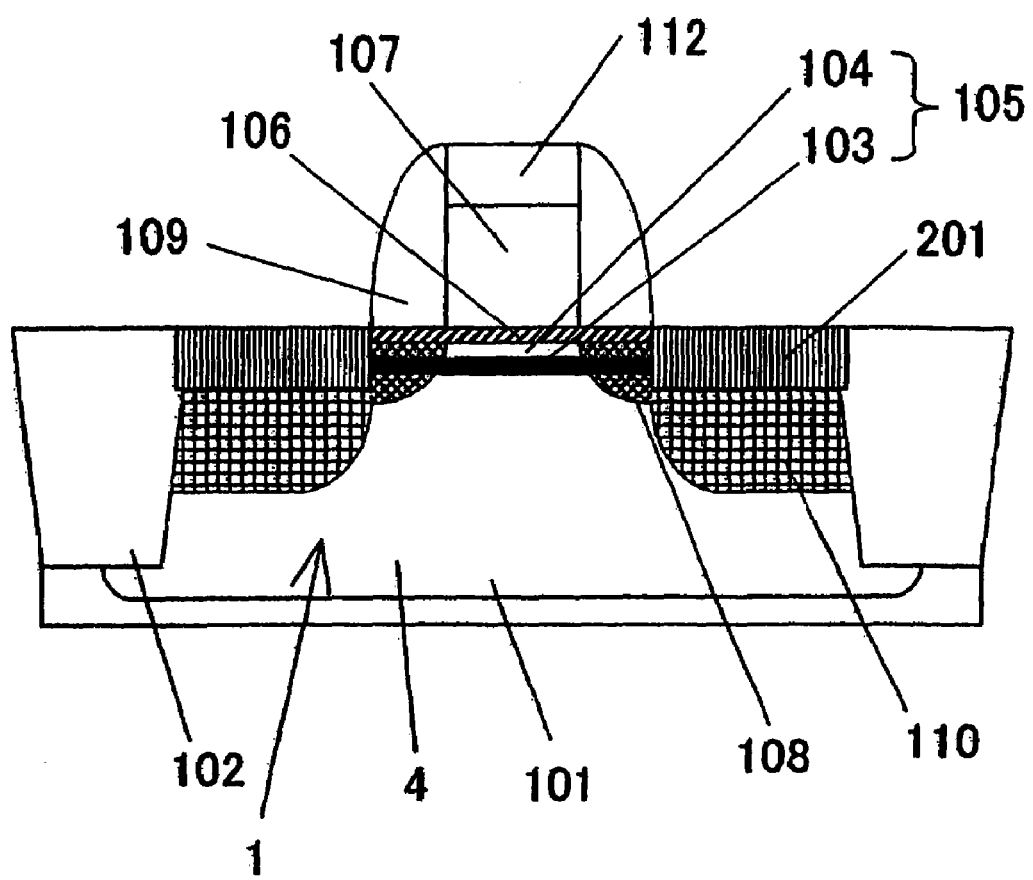
FIG. 17 is a sectional view schematically showing a sectional structure of a conventional p-channel field effect transistor.

Description will be made of comparison between the semiconductor device thus constructed and fabricated and a conventional semiconductor device as to their effects. FIG. 17 is a sectional view showing the structure of a p-channel heterojunction field effect transistor as the conventional semiconductor device.

The conventional semiconductor device has the same structure as the p-channel heterojunction field effect transistor of the present embodiment (FIG. 1) except that the cobalt silicide layer 201 comprises cobalt germanosilicide Co(SiGe) containing germanium. In the fabrication of the conventional semiconductor device, silicon-germanium layer 103 is not removed unlike the step of the present embodiment illustrated in FIG. 8 and, thereafter, cobalt silicide layer 201 is formed on high-concentration p-type impurity diffusion layer 110 in which the silicon-germanium layer 103 is present. For this reason, germanium impedes the formation of a low-resistant phase during the cobalt silicide formation. As a result, the resistance of the cobalt silicide layer 201 is higher than that of the cobalt silicide layer 111 of the transistor according to the present embodiment if these layers are formed at equal annealing temperature. This means that substantial parasitic resistance is developed undesirably.

In use of the conventional device, a desired voltage is not applied across the source and the drain due to the influence of such parasitic resistance, which results in reduced drive current. In attempt to avoid such an inconvenience, the annealing temperature needs to be raised by 100° C. or more to lower the resistance of the cobalt silicide layer containing germanium. In this case structural changes due to heat such as variation in concentration profile caused by impurity diffusion and relaxation of the lattice strain of the silicon-germanium layer are concerned about. Thus, the conventional semiconductor device has a structure that is very difficult to fabricate.

In the semiconductor device of the present embodiment, in contrast, the high-concentration p-type impurity diffusion layer 110 in which the cobalt silicide layer 111 is formed is made of silicon, and germanium impeding the formation of a low-resistant $CoSi_2$ phase is present in a very small amount at only the connecting portions with the extension layers 108. That is, the silicon-germanium layer 103 is formed only under the gate electrode body 107 and the side protection film 109. For this reason, the silicide layer 111 contains germanium in a very localized part of the connecting region with the extension layers 108.

According to the results of study by the inventors of the present invention, the germanium concentration of the cobalt silicide layer 111 is estimated to be about $10^{11}$ atoms/cm² or less. In the claims, the expression "the silicide layer is substantially germanium-free" means that the germanium concentration of the silicide layer is about $10^{11}$ atoms/cm² or less.

Also, according to the results of study by the inventors of the present invention, the germanium concentration of the silicide layer is preferably more than 0 atomic % and not more than 5 atomic % so as not to impede the formation of a low-resistant $CoSi_2$ phase.

From the foregoing, $CoSi_2$, which is a low-resistant cobalt silicide phase, is formed in the source and drain electrodes 3 in spite of the use of heterojunction 105 containing silicon-germanium in the channel layer 105. As a result, it is possible to obtain a transistor having low parasitic resistance and high drive current (a p-channel field effect transistor in this embodiment.) The field effect transistor according to the present embodiment has another advantage that there is no need to raise the process temperature in the fabrication notwithstanding the fact that the transistor has the channel layer 105 containing silicon-germanium, while the fabrication thereof is easy.

According to the semiconductor device fabrication method of the present embodiment, germanium, which acts as a contamination source in the silicon process, can be eliminated by dry etching without any chance of its exposure at the surface. Therefore, contaminative process steps are collectively reduced into a single dry etching step and, hence, the number of such steps can be minimized, whereby contamination in the succeeding steps can be avoided. As a result, it becomes possible to reduce the risk of germanium contamination.

The following description is directed to variations of the present embodiment.

An n-channel heterojunction field effect transistor can be obtained as a first variation by using an impurity having the opposite polarity (conductivity type) in the formation of the transistor.

A CMOS comprising heterojunction field effect transistors according to the present embodiment can be obtained as a second variation by fabricating an n-channel heterojunction field effect transistor and a p-channel heterojunction field effect transistor at a time.

A DTMOS (Dynamic Threshold voltage MOSFET) using a heterojunction field effect transistor according to the present embodiment can be obtained as a third variation by short-circuiting between the body region 4 of the substrate 101 and the gate electrode 3 using wire or the like. Since the body region 4 and the gate electrode 2 always become equal potential in this DTMOS, the DTMOS can operate as a transistor having higher drive current and lower parasitic resistance.

A fourth variation may have a silicon-germanium-carbon layer formed instead of the silicon-germanium layer 103. Such a construction can obtain the same effect as the construction of FIG. 1.

(Second Embodiment)

Figure 12:
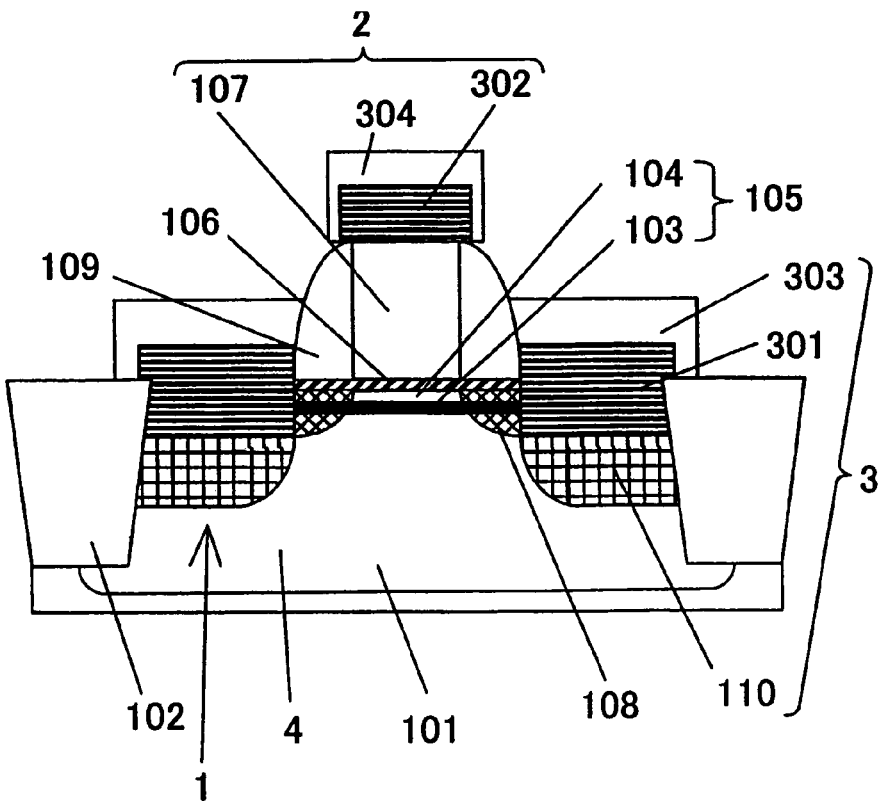
FIG. 12 is a sectional view schematically showing a sectional structure of a semiconductor device according to the second embodiment of the present invention.

FIG. 12 is a sectional view schematically showing a sectional structure of a semiconductor device according to the second embodiment of the present invention. Like reference characters designate like or corresponding parts throughout FIGS. 1 and 12.

The present embodiment is one in which the first embodiment is varied as follows. That is, the present embodiment has a high-concentration p-type impurity diffusion layer 301 made of a silicon layer formed on the source and drain regions 110, and a high-concentration p-type polysilicon layer 302 formed on the gate electrode body 107. Further, cobalt silicide layers 303 and 304 are formed on the surfaces of the high-concentration p-type impurity diffusion layer 301 and high-concentration p-type polysilicon layer 302, respectively. The gate electrode body 107, high-concentration p-type polysilicon layer 302 and cobalt silicide layer 304 constitute the gate electrode 2, while the source and drain regions 110, p-type impurity diffusion layer 301 and cobalt silicide layer 303 constitute the source and drain electrodes 3.

Description will be made of a fabrication method of the semiconductor device according to the present embodiment thus constructed.

Figure 13:
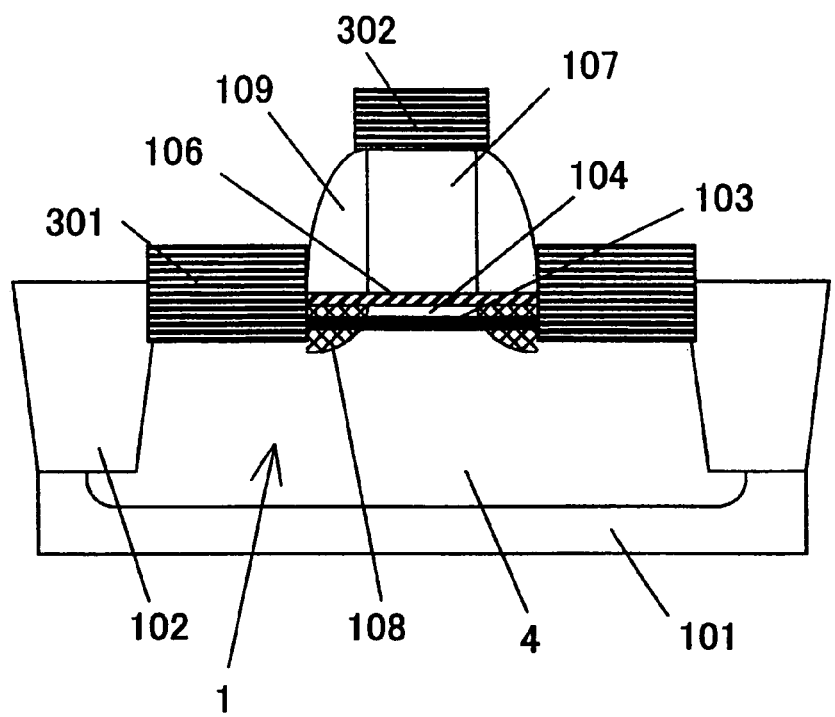
FIG. 13 is a sectional view illustrating a characteristic step of a fabrication method of the semiconductor device shown in FIG. 12.
Figure 14:
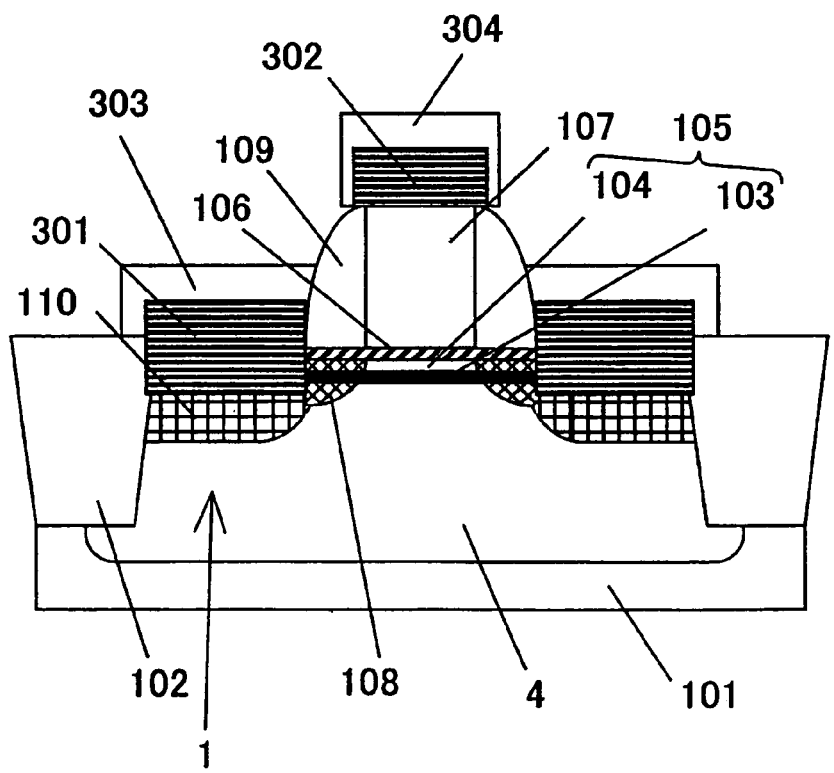
FIG. 14 is a sectional view illustrating a characteristic step of the fabrication method of the semiconductor device shown in FIG. 12.

FIGS. 13 and 14 are sectional views illustrating characteristic steps of the semiconductor device fabrication method according to the present embodiment.

Figure 10:
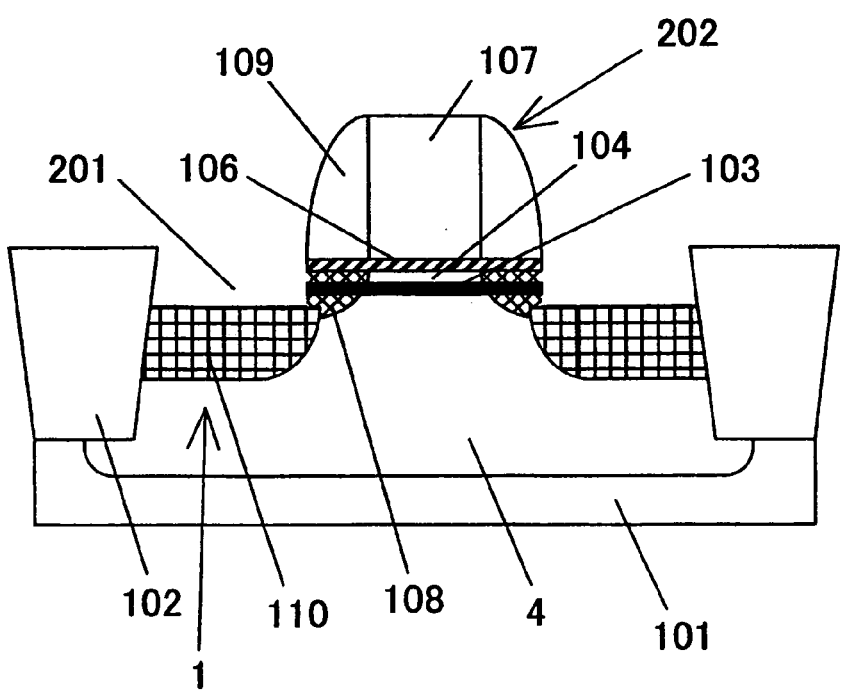
FIG. 10 is a sectional view illustrating each step of the fabrication method of the semiconductor device shown in FIG. 1.

The fabrication method according to the present embodiment is the same as the fabrication method according to the first embodiment up to the step of the first embodiment illustrated in FIG. 10. That is, the entire surface of the substrate 101 is intentionally over-etched in the step illustrated in FIG. 8 to form the recess 201 as shown in FIG. 9, followed by the formation of the source and drain regions 110 directly under the recess. Subsequently, in the step illustrated in FIG. 13, silicon layer 301 and polysilicon layer 302 each having a thickness not more than 60 nm (specifically a thickness of about 30 nm in this embodiment) are selectively grown on the source and drain regions 110 exposed in the recess 201 and the gate electrode body 107, respectively, by the UHV-CVD process or a like process. In this case addition of chlorine or hydrogen chloride makes it easier to obtain the selectively-grown silicon layer. Thereafter, ion implantation of a p-type impurity such as boron and RTA at 900° C. or higher for 60 seconds or shorter are performed to turn the silicon layer 301 and the polysilicon layer 302 into a high-concentration degenerate p-type silicon layer and a high-concentration degenerate p-type polysilicon layer, respectively, the high-concentration degenerate p-type silicon and polysilicon layers 301 and 302 each having a concentration not less than $5 \times 10^{19}$ atoms/cm$^2$.

Subsequently, in the step illustrated in FIG. 14, the cobalt silicide layers 303 and 304 are formed on the silicon layer 301 and the polysilicon layer 302, respectively. At that time, the silicon layer 301 and the polysilicon layer 302 to be produced into silicide are completely germanium-free.

Specifically, cobalt is first deposited to a thickness not more than 20 nm (specifically to a thickness of about 10 nm in this embodiment) over the entire surface of the substrate 101 by sputtering or a like process. Thereafter, RTA is performed at a temperature not higher than 600° C. (preferably 400° C. or higher, specifically at 500° C. in this embodiment) for about one minute to allow cobalt to react with silicon forming the silicon layer 301 and polysilicon layer 302, thereby forming a CoSi$_2$ phase having a high resistance (several tens of $\Omega/\square$).

Subsequently, unreacted cobalt remaining on the device isolation film 102 and side protection film 109 is eliminated by cleaning to obviate short-circuiting between the source and drain electrodes and the gate electrode during use.

Subsequently, RTA is performed at a temperature not lower than 600° C., specifically at 700° C. in this embodiment, for about one minute to obtain the cobalt silicide layers 303 and 304 each made of a CoSi$_2$ phase having a low resistance (several $\Omega/\square$).

Thereafter, non-illustrated process steps including interlayer insulator formation, contact hole formation and wire formation are performed to complete a p-channel heterojunction transistor according to the present embodiment.

According to the present embodiment, the high-concentration p-type impurity diffusion layer 301, in which the cobalt silicide layer 303 is formed, forming part of the source and drain electrodes 3 is made of silicon and is completely free of germanium, which impedes the formation of a low-resistant CoSi$_2$ phase.

Further, the raised-up structure is adopted to suppress the short channel effect and allow the impurity diffusion layer forming the source and drain to be formed deeper and, hence, the present embodiment can further reduce parasitic resistance than the conventional source and drain structure.

Therefore, as compared with the conventional device in which the silicon-germanium layer is left in the source and drain electrodes, the present embodiment has the cobalt silicide layer 303 having a low resistance and hence is capable of reducing the parasitic resistance of the device while obtaining high drive current inherent to the heterojunction channel.

Also, although in the present embodiment silicon-germanium is present in a very small amount at the connecting portions between the extension layers 108 and the source and drain electrodes, it is possible to prevent the silicon-germanium from becoming silicide. Therefore, the present embodiment makes it possible to form a low-resistance cobalt silicide layer (CoSi$_2$) reliably. As a result, a p-channel field effect transistor having low parasitic resistance and high driving force can be obtained.

According to the present embodiment, germanium, which acts as a contamination source in the silicon process, can be eliminated by dry etching without any chance of its exposure at the surface. Therefore, contaminative process steps are collectively reduced into a single dry etching step and, hence, the number of such steps can be minimized, whereby contamination in the succeeding steps can be avoided. As a result, it becomes possible to reduce the risk of germanium contamination.

It is needless to say that variations of the present embodiment similar to the first to fourth variations of the first embodiment are possible and can obtain the same advantages as the first to fourth variations of the first embodiment.

(Third Embodiment)

Figure 15:
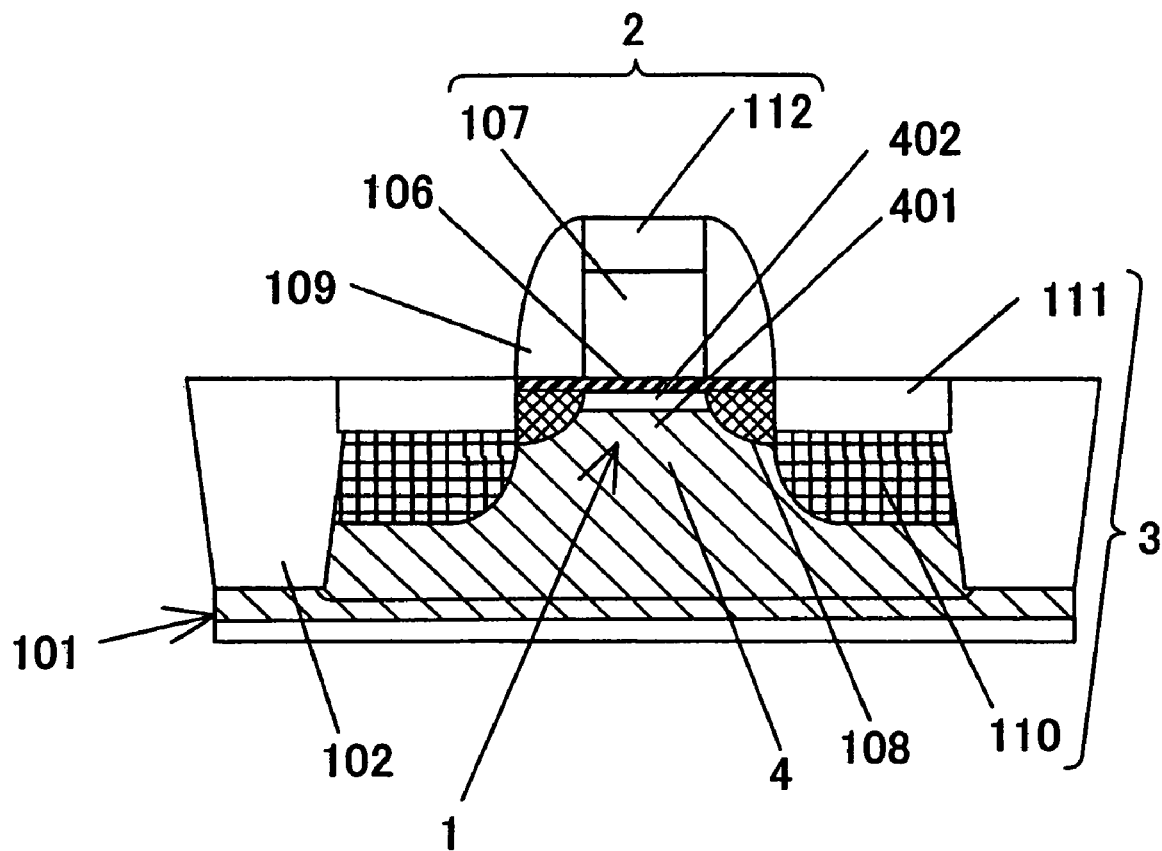
FIG. 15 is a sectional view schematically showing a sectional structure of a semiconductor device according to the third embodiment of the present invention.

FIG. 15 is a sectional view schematically showing a sectional structure of a semiconductor device according to the third embodiment of the present invention. Like reference characters designate like or corresponding parts throughout FIGS. 1 and 15.

The present embodiment is one in which the first embodiment is varied as follows. That is, in the present embodiment, the bulk silicon semiconductor layer (including the body region 4, source and drain regions 110 and a lower portion of the extension layers 8) of the first embodiment is replaced with a relaxed silicon-germanium layer 401 formed on the substrate 101. The silicon-germanium layer 103 and silicon layer 104 of the first embodiment are replaced with a strained silicon layer 402 formed on the relaxed silicon-germanium layer 401. The present embodiment is similar to the first embodiment except these features. A semiconductor device fabrication method according to the present embodiment is similar to the semiconductor device fabrication method according to the first embodiment up to the step illustrated in FIG. 8 except the formation of the strained silicon layer 402 serving as the channel layer on the relaxed silicon-germanium layer 401 instead of the formation of the silicon-germanium layer 103 and silicon layer 104 on the bulk silicon semiconductor layer. With respect to the steps succeeding the FIG. 8 step of the semiconductor device fabrication method of the first embodiment, the method of the present embodiment is different from that of the first embodiment in the following features. That is, in forming sidewall 109 the silicon oxinitride film 106' which will be the gate insulator 106 is removed together with the strained silicon layer (having a thickness of 10 nm in this embodiment) 402 and a part of the relaxed silicon-germanium layer 401 (a portion extending from the surface to a depth not less than 10 nm, specifically to a depth of about 10 nm in this embodiment) by over etching. Subsequently, a silicon layer is selectively grown to a thickness not less than 20 nm, followed by producing the silicon layer into silicide to form cobalt silicide 111 as in the first embodiment. Other features are similar to the corresponding features of the first embodiment.

The semiconductor device of the present embodiment thus constructed can obtain the same advantage as can be obtained by the first embodiment.

An n-channel strained silicon field effect transistor can be obtained as a variation by using an impurity having the opposite polarity in the formation of the transistor.

(Fourth Embodiment)

Figure 16:
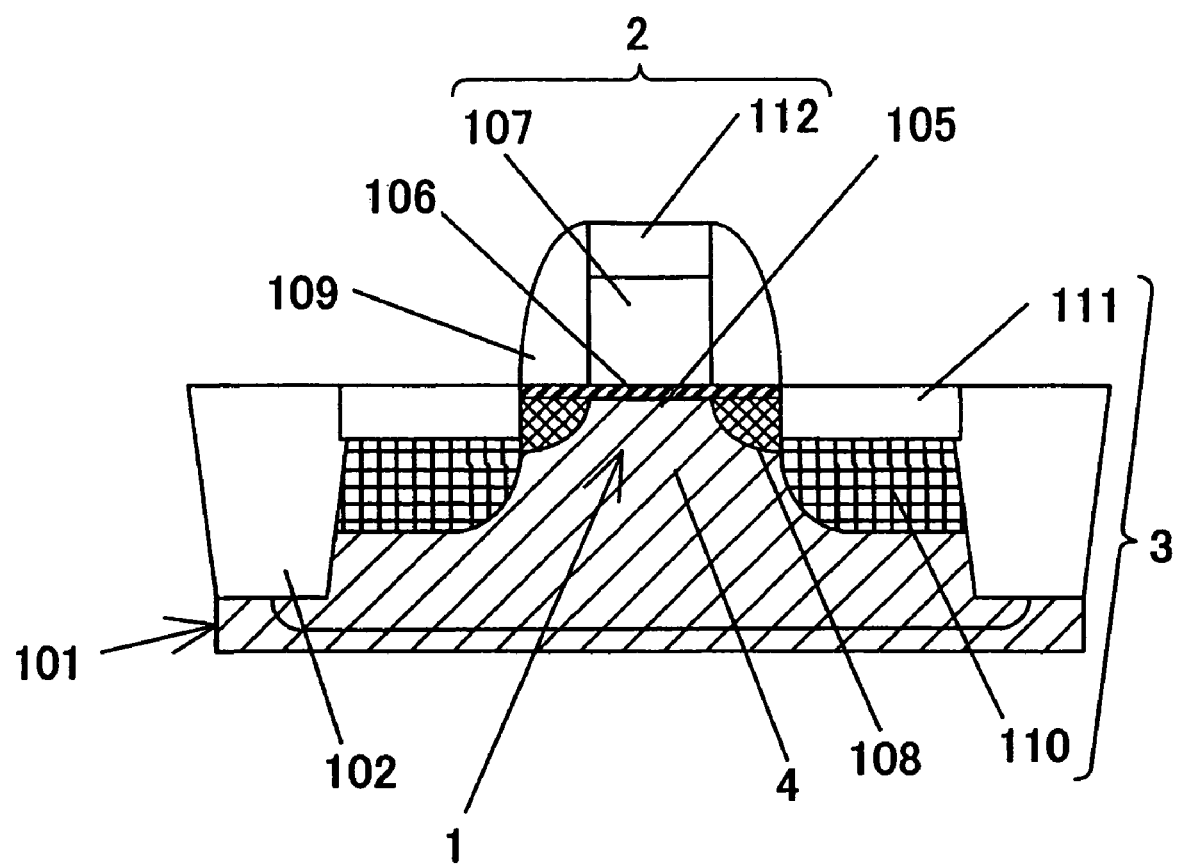
FIG. 16 is a sectional view schematically showing a sectional structure of a semiconductor device according to the fourth embodiment of the present invention.

FIG. 16 is a sectional view schematically showing a sectional structure of a semiconductor device according to the fourth embodiment of the present invention. Like reference characters designate like or corresponding parts throughout FIGS. 1 and 16.

The present embodiment is one in which the first embodiment is varied as follows. That is, in the present embodiment, the bulk silicon semiconductor layer 101 of the first embodiment is replaced with a germanium substrate 101. The silicon-germanium layer 103 and silicon layer 104 of the first embodiment are replaced with bulk germanium of the substrate 101. Specifically, the channel layer 105 is constituted of a layered portion of the semiconductor (germanium) forming the substrate 101 which contacts the gate insulator 106 under the gate electrode 2. The present embodiment is similar to the first embodiment except this feature.

Figure 8:
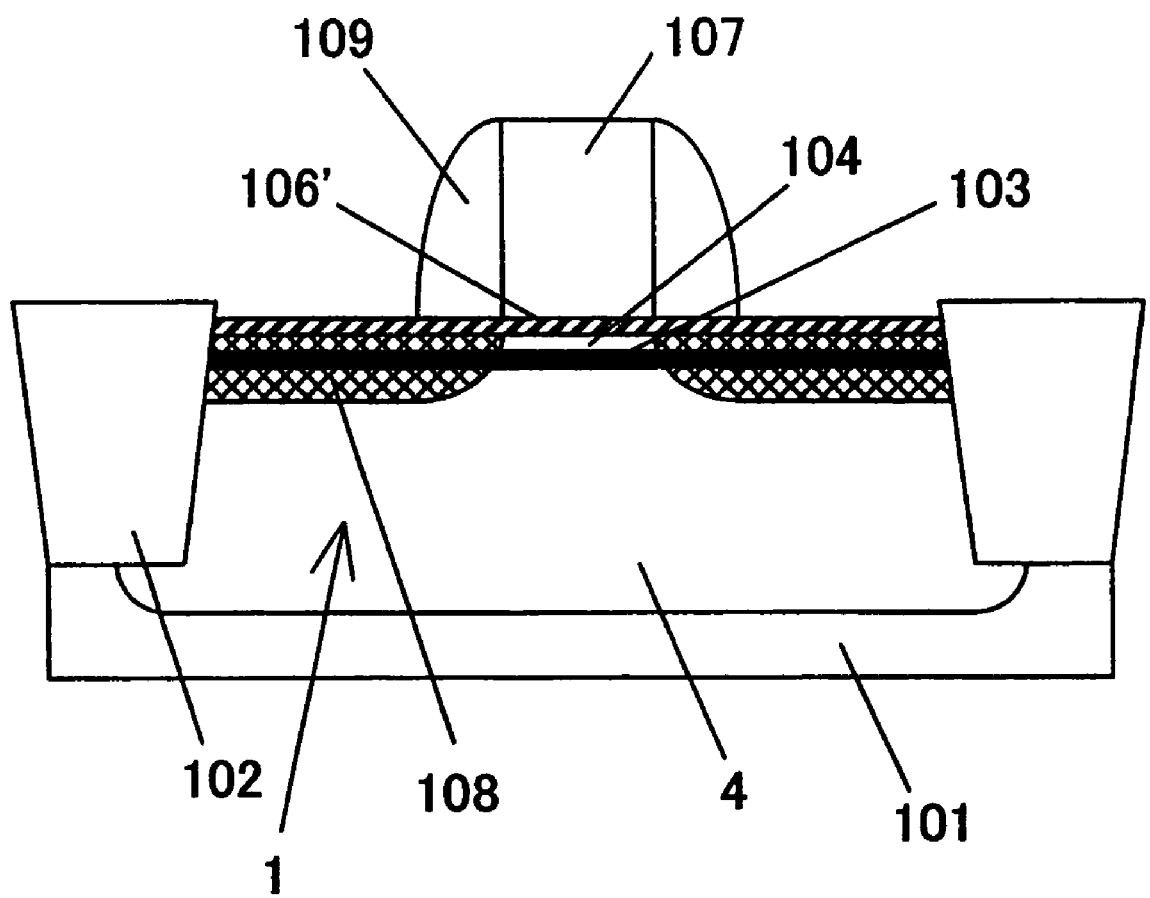
FIG. 8 is a sectional view illustrating each step of the fabrication method of the semiconductor device shown in FIG. 1.

A semiconductor device fabrication method according to the present embodiment is similar to the semiconductor device fabrication method according to the first embodiment up to the step of FIG. 8 except that the channel layer is not formed on the bulk germanium semiconductor layer instead of the formation of the silicon-germanium layer 103 and silicon layer 104 on the bulk silicon semiconductor layer. With respect to the steps succeeding the FIG. 8 step of the semiconductor device fabrication method of the first embodiment, the method of the present embodiment is different from that of the first embodiment in the following features. That is, in forming sidewall 109 the silicon oxinitride film 106' which will be the gate insulator 106 is removed together with a part of germanium 4 (a portion extending from the surface to a depth not less than 20 nm, specifically to a depth of about 20 nm in this embodiment) by over etching. Subsequently, a silicon layer is selectively grown to a thickness not less than 20 nm (specifically to a thickness of about 20 nm in this embodiment), followed by producing the silicon layer into silicide to form cobalt silicide 111 as in the first embodiment. Other features are similar to the corresponding features of the first embodiment.

The semiconductor device of the present embodiment thus constructed can obtain the same advantage as can be obtained by the first embodiment.

A first variation of the present embodiment may employ a silicon-germanium substrate as the substrate 101 instead of the germanium substrate.

An n-channel field effect transistor can be obtained as a second variation by using an impurity having the opposite polarity in the formation of the transistor.

It will be apparent from the foregoing description that many improvements and other embodiments of the present invention may occur to those skilled in the art. Therefore, the foregoing description should be construed as an illustration only and is provided for the purpose of teaching the best mode for carrying out the present invention to those skilled in the art. The details of the structure and/or the function of the present invention can be modified substantially without departing from the spirit of the present invention.

What is claimed is:

1. A semiconductor device comprising:
   a semiconductor substrate;
   a gate electrode formed on the semiconductor substrate;
   a pair of source and drain electrodes respectively formed in regions of the semiconductor substrate situated on opposite sides of the gate electrode in a plan view; and
   a channel layer situated below the gate electrode to sandwich an gate insulator therebetween and intervening between the pair of source and drain electrodes, wherein:
   at least one of the channel layer and an underlayer directly underlying the channel layer contains germanium;
   a silicide layer forming at least a part of the source and drain electrodes has a lower germanium concentration than one of the channel layer and the underlayer; and
   wherein the germanium concentration of the silicide layer is more than 0 atomic % and not more than 5 atomic %.

2. The semiconductor device according to claim 1, wherein the channel layer has a heterojunction between silicon and a silicon-germanium layer or a silicon-germanium-carbon layer.

3. The semiconductor device according to claim 2, wherein the channel layer forms a p-channel when conducting.

4. The semiconductor device according to claim 1, wherein the underlayer is a relaxed silicon-germanium layer, while the channel layer is a strained silicon layer formed on the relaxed silicon-germanium layer.

5. The semiconductor device according to claim 1, wherein:
   the source and drain electrodes have source and drain regions each comprising an impurity diffusion region;
   a body region having a different conductivity type from the source and drain regions is formed below the channel layer to contact the source and drain regions; and
   the gate electrode is electrically connected to the body region.

6. The semiconductor device according to claim 1, wherein:
   a side protection film formed by an insulating film is formed to cover sides of the gate electrode;
   a pair of extension layers are formed to be positioned below the side protection film; and
   the channel layer is electrically connected to the pair of source and drain electrodes by the pair of extension layers.

* * * * *